United States Patent
Higaki et al.

(10) Patent No.: US 10,508,956 B1
(45) Date of Patent: Dec. 17, 2019

(54) TEMPERATURE ESTIMATION DEVICE AND ELECTRIC DEVICE

(71) Applicant: Mitsubishi Electric Corporation, Chiyoda-ku (JP)

(72) Inventors: Yusuke Higaki, Chiyoda-ku (JP); Hirokazu Nakabayashi, Chiyoda-ku (JP); Shoji Morita, Chiyoda-ku (JP); Yutaka Kuboyama, Chiyoda-ku (JP); Ryota Kondo, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/468,172

(22) PCT Filed: Mar. 17, 2017

(86) PCT No.: PCT/JP2017/010966
§ 371 (c)(1),
(2) Date: Jun. 10, 2019

(87) PCT Pub. No.: WO2018/167954
PCT Pub. Date: Sep. 20, 2018

(51) Int. Cl.
*G01K 3/04* (2006.01)
*H02M 1/08* (2006.01)
*H05K 7/20* (2006.01)

(52) U.S. Cl.
CPC .......... *G01K 3/04* (2013.01); *H02M 1/08* (2013.01); *H05K 7/20909* (2013.01); *H05K 7/20945* (2013.01)

(58) Field of Classification Search
None
See application file for complete search history.

(56) References Cited

U.S. PATENT DOCUMENTS

| 10,349,562 | B2 * | 7/2019 | Kondo | H05K 5/0017 |
| 2003/0071594 | A1 | 4/2003 | Kleinau et al. | |
| 2003/0076061 | A1 | 4/2003 | Kleinau et al. | |
| 2003/0076064 | A1 | 4/2003 | Kleinau et al. | |
| 2003/0076065 | A1 | 4/2003 | Shafer et al. | |
| 2007/0132446 | A1 | 6/2007 | Kleinau et al. | |
| 2012/0281433 | A1 * | 11/2012 | Yamanaka | H02M 7/003 363/13 |

(Continued)

FOREIGN PATENT DOCUMENTS

| EP | 2 830 202 A1 | 1/2015 |
| JP | 2003-70278 A | 3/2003 |

(Continued)

OTHER PUBLICATIONS

International Search Report dated Apr. 11, 2017 in PCT/JP2017/010966 filed Mar. 17, 2017.

*Primary Examiner* — Cassandra F Cox
(74) *Attorney, Agent, or Firm* — Oblon, McClelland, Maier & Neustadt, L.L.P.

(57) ABSTRACT

A temperature estimation device calculates a first estimation temperature of a reactor on the basis of a reference estimation temperature to which a first lag period is provided and outputs from a temperature change amount calculation unit to which a second lag period is provided, predicts a second temperature change amount of the reactor over a predetermined period on the basis of the first estimation temperature, and then predicts a second estimation temperature of the reactor.

20 Claims, 13 Drawing Sheets

100

(56) References Cited

U.S. PATENT DOCUMENTS

| | | | |
|---|---|---|---|
| 2016/0197545 A1* | 7/2016 | Nemoto | G01R 19/0092 363/78 |
| 2017/0105068 A1* | 4/2017 | Lesso | H04R 3/007 |
| 2018/0062523 A1* | 3/2018 | Rainer | G01R 15/185 |

FOREIGN PATENT DOCUMENTS

| | | |
|---|---|---|
| JP | 2009-303329 A | 12/2009 |
| JP | 2016-158341 A | 9/2016 |
| WO | WO 2013/140511 A1 | 9/2013 |

* cited by examiner

50

FIG. 10
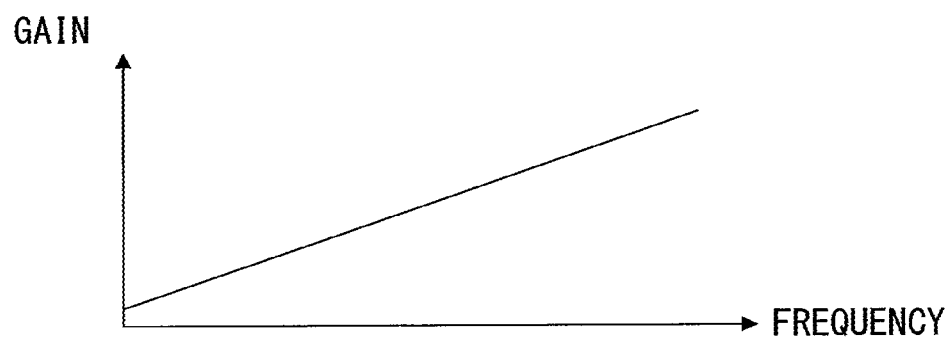
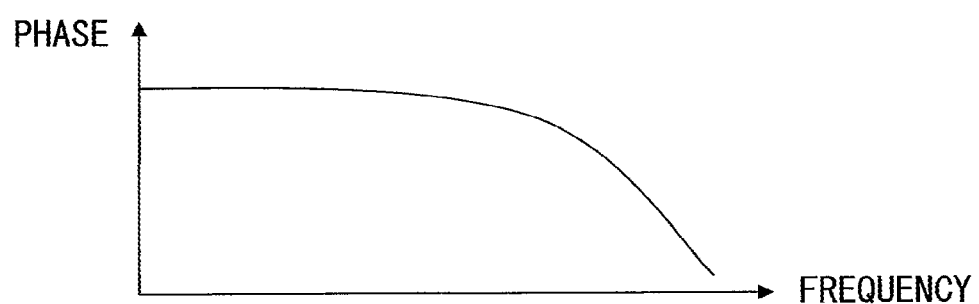

● CALCULATION EXECUTION TIMING OF DIGITAL FILTER

TEMPERATURE ESTIMATION DEVICE AND ELECTRIC DEVICE

TECHNICAL FIELD

The present invention relates to a temperature estimation device which estimates the temperature of an inductor component provided in an electric device, and an electric device including the temperature estimation device.

BACKGROUND ART

When an electric device such as a power conversion device passes or receives power to or from a power supply, in an inductor component such as a reactor provided in the electric device, temperature increase occurs in accordance with conduction loss caused by the winding resistance and flowing current of the inductor component. In order to suppress excessive temperature increase in the inductor component, the size of the inductor component itself may be increased. However, a space for placing the increased-size inductor component is needed. Accordingly, in order to suppress excessive temperature increase in the inductor component while avoiding size increase in the inductor component, control is used in which, while the temperature of the inductor component is acquired, operation control of the electric device is adjusted to decrease flowing current of the inductor component.

While the temperature of the inductor component changes in accordance with conduction loss due to flowing current as described above, the temperature change at this time is accompanied with a lag period specific to the inductor component. That is, after the flowing current increases, time lag occurs until the temperature of the inductor component itself increases. In the control in which operation control of the electric device is adjusted after the temperature of the inductor component is actually measured using a temperature measurement device and temperature increase is detected, it takes time until the temperature of the inductor component decreases, and thus there is a possibility that the permissible temperature is exceeded. Therefore, in order to accurately obtain the temperature of the inductor component which changes with a lag period relative to change in the flowing current without using a measurement device, technology in which the temperature of the inductor component at a predetermined time is estimated is disclosed as shown below.

A current detection unit detects the current value of AC current flowing in accordance with a load. A temperature prediction unit predicts the temperature of a predetermined part in an optional operation continuation period on the basis of information during operation and the current value detected by the current detection unit. A temperature $\theta tn$ of a predetermined part at a predetermined time tn is calculated using the following expression.

$$\theta tn = \theta t(n-1) + (sat1 - \theta t(n-1)) \times [1 - EXP(-(tn-t(n-1))/\tau1] - (\text{reference temperature} - \text{ambient temperature})$$

Where $$\theta sat1 = I \times I \times K1$$

$\theta tn$: temperature of predetermined part at time tn
$\theta t(n-1)$: temperature of predetermined part at time $t(n-1)$
$\theta sat1$: saturation temperature
I: current value of AC current flowing in accordance with load
K1: coefficient during operation of power conversion unit
$\tau1$: thermal time constant during operation of power conversion unit
Reference temperature: ambient temperature around power conversion device when operation test for power conversion device was performed in advance
Ambient temperature: ambient temperature around power conversion device as product By substituting the present current value into I, substituting an operation start time of the power conversion unit into t(n-1), substituting the present time into tn, and substituting the reference temperature into $\theta t(n-1)$, the temperature of the predetermined part at present can be calculated.

In addition, by substituting the present current value into I, substituting the present time into t(n- 1), substituting a desired time after the present (in the future) into tn, and substituting the temperature of the predetermined part at present into $\theta t(n-1)$, the temperature of the predetermined part at the desired time can be calculated.

In addition, a power conversion device including the temperature prediction unit outputs an instruction about heat resistance protection for the inductor component on the basis of the temperature of the inductor component predicted as described above (see, for example, Patent Document 1).

CITATION LIST

Patent Document

Patent Document 1: International Publication No. WO2013/140511 (Abstract, paragraphs [0012]-[0024], FIG. 1, FIG. 2)

SUMMARY OF THE INVENTION

Problems to be Solved by the Invention

In the above conventional technology of estimating the temperature of the conventional inductor component, the temperature of the inductor component which changes with a lag period is estimated using a thermal time constant (lag period) during operation of the power conversion unit. However, there is a problem that this method has a limitation in estimating the temperature of the inductor component accurately.

In addition, there is a problem that the power conversion device cannot assuredly suppress temperature increase in the inductor component.

The present invention has been made to solve the above problems, and an object of the present invention is to provide a temperature estimation device capable of accurately estimating the temperature of the inductor component on the basis of the device inside temperature, voltage, and current.

Another object of the present invention is to provide an electric device capable of assuredly suppressing temperature increase in the inductor component on the basis of the temperature of the inductor component accurately estimated by the temperature estimation device.

Solution to the Problems

A temperature estimation device according to the present invention is a temperature estimation device for estimating a temperature of an inductor component in an electric device connected to a DC power supply, the temperature estimation device including: a first calculation unit which receives a device inside temperature of the electric device, provides a first lag period to the device inside temperature, and outputs a reference estimation temperature of the inductor component; a second calculation unit which calculates a first temperature change amount of the inductor component on the basis of detection values of voltage and current between the DC power supply and the electric device, provides a second lag period to the first temperature change amount, and outputs a resultant value; a third calculation unit which adds the output from the second calculation unit, to the reference estimation temperature, to calculate a first estimation temperature of the inductor component; a first prediction unit which predicts, on the basis of the first estimation temperature, a second temperature change amount of the inductor component from the first estimation temperature over a predetermined period; and a second prediction unit which adds the second temperature change amount to the first estimation temperature, to predict a second estimation temperature of the inductor component.

An electric device according to the present invention includes: the temperature estimation device configured as described above; an upper limit value calculation unit which calculates a current upper limit value for limiting current passed/received between the electric device and the DC power supply, on the basis of the second estimation temperature and a temperature target value for the inductor component; and a control unit which controls output of the electric device, wherein the control unit adjusts the current on the basis of the current upper limit value.

Effect of the Invention

In the temperature estimation device according to the present invention, the reference estimation temperature to which the first lag period is provided, and the first temperature change amount to which the second lag period is provided, are added, thereby calculating the first estimation temperature of the inductor component. Then, the second estimation temperature is estimated on the basis of the first estimation temperature. Therefore, it is possible to accurately estimate the temperature of the inductor component.

The electric device according to the present invention adjusts current on the basis of the temperature of the inductor component estimated by the temperature estimation device, thereby suppressing increase in the temperature of the inductor component. Thus, it becomes possible to suppress deterioration of the inductor component and perform stable operation of the electric device.

BRIEF DESCRIPTION OF THE DRAWINGS

FIG. 10 shows an example of the characteristics of a differential filter according to embodiment 1 of the present invention.

DESCRIPTION OF EMBODIMENTS

Embodiment 1

Hereinafter, a temperature estimation device 100 according to embodiment 1 of the present invention will be described with reference to the drawings.

Figure 1:
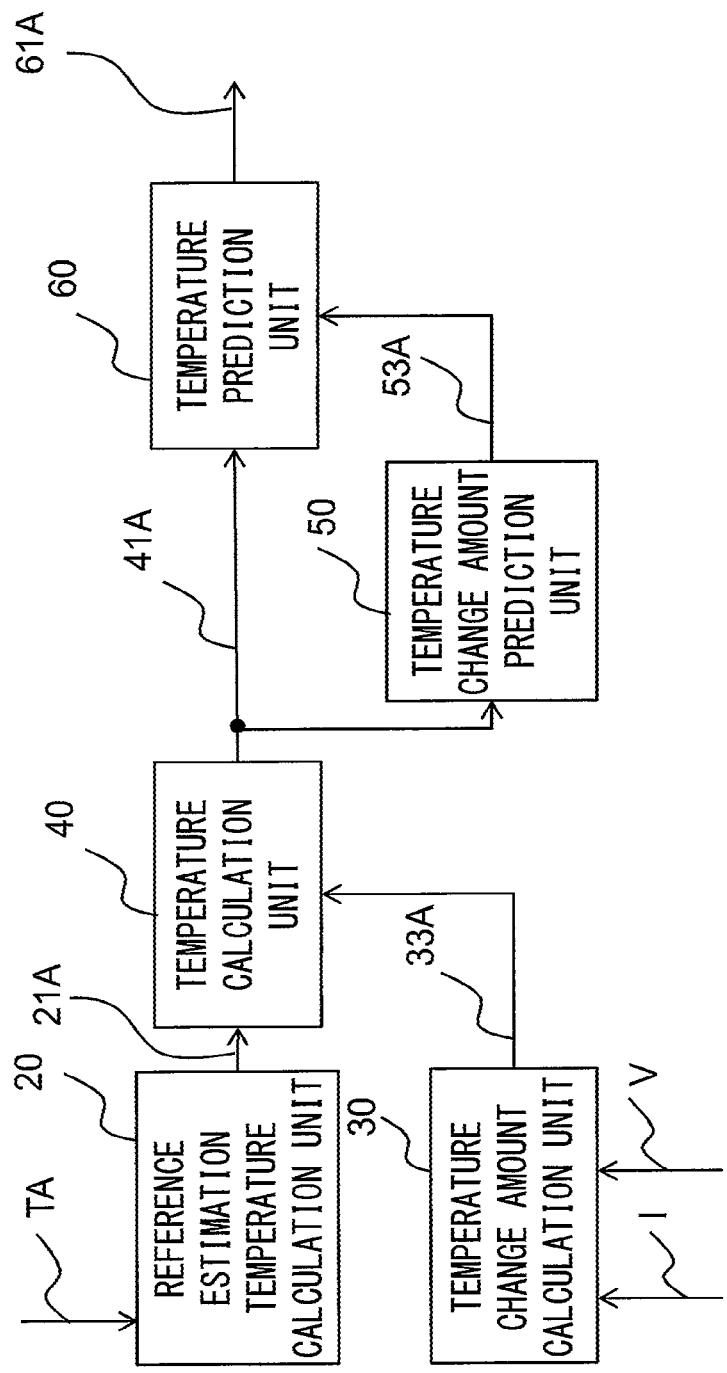
FIG. 1 is a diagram showing the configuration of a temperature estimation device according to embodiment 1 of the present invention.

FIG. 1 is a diagram showing the configuration of the temperature estimation device 100 according to embodiment 1 of the present invention.

Figure 2:
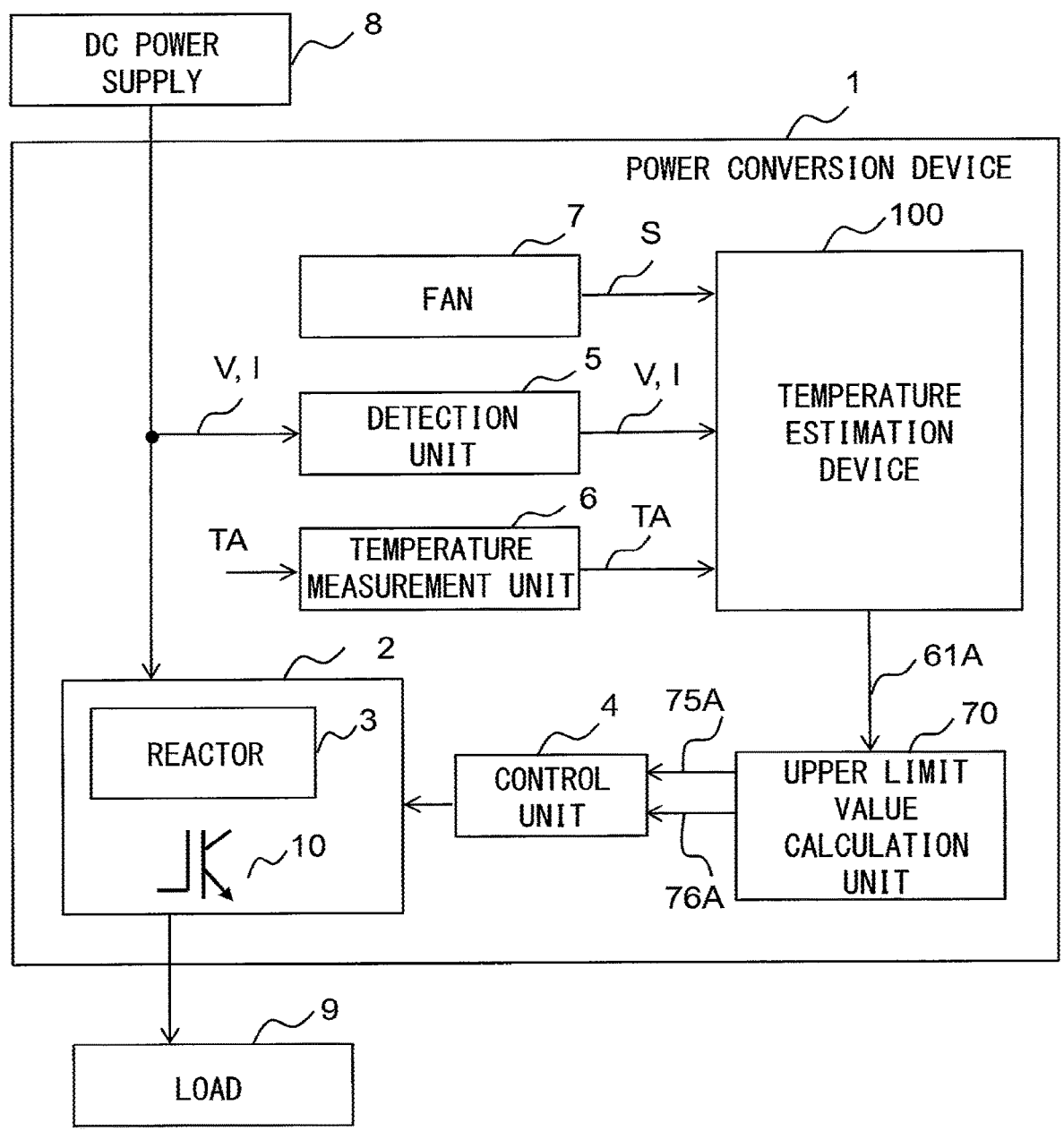
FIG. 2 is a diagram showing a configuration in which the temperature estimation device according to embodiment 1 of the present invention is applied to a power conversion device.

FIG. 2 is a diagram showing a configuration in which the temperature estimation device 100 according to embodiment 1 of the present invention is applied to a power conversion device 1.

Figure 3:
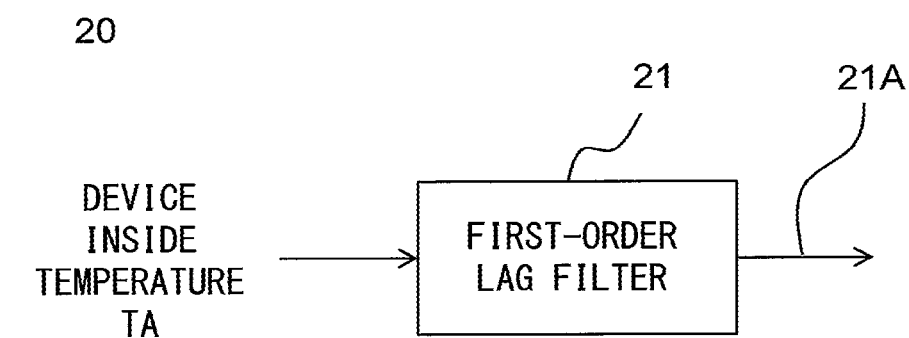
FIG. 3 is a diagram showing the configuration of a reference estimation temperature calculation unit according to embodiment 1 of the present invention.

FIG. 3 is a diagram showing the configuration of a reference estimation temperature calculation unit 20 shown in FIG. 1.

Figure 4:
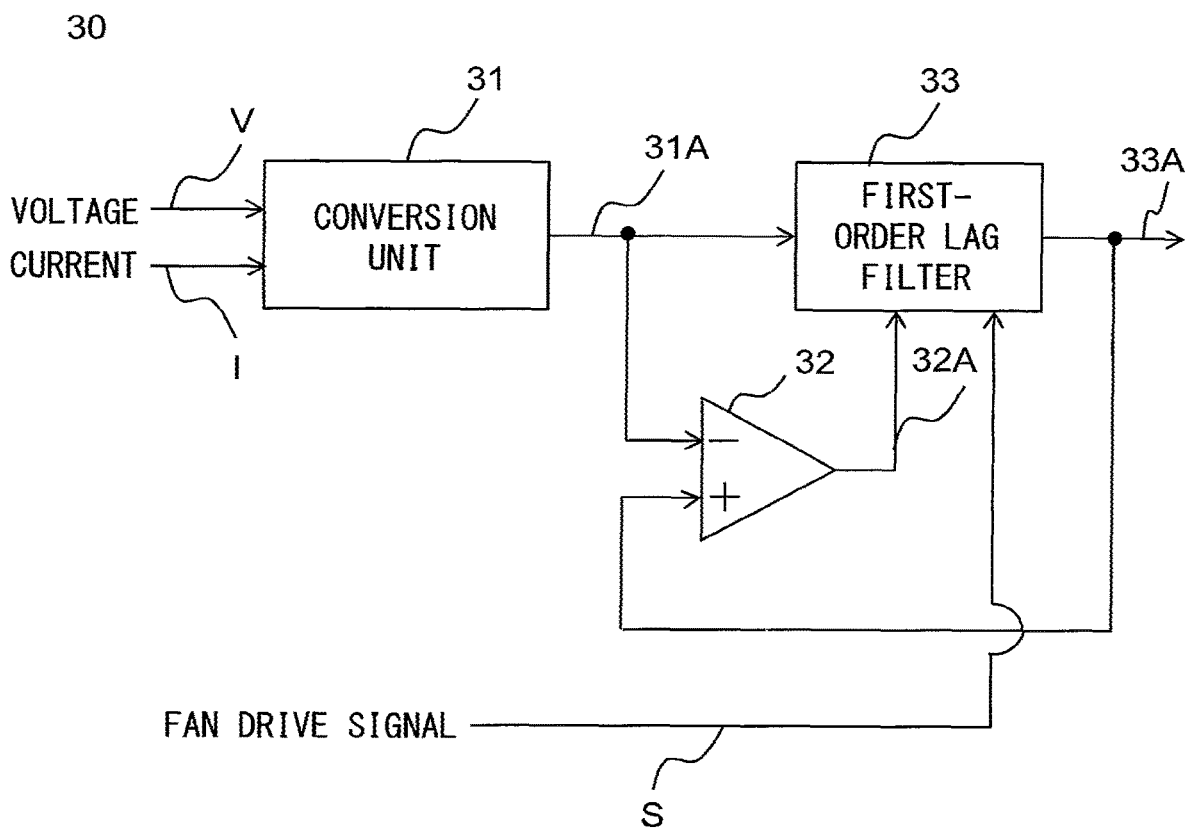
FIG. 4 is a diagram showing the configuration of a temperature change amount calculation unit according to embodiment 1 of the present invention.

FIG. 4 is a diagram showing the configuration of a temperature change amount calculation unit 30 shown in FIG. 1.

Figure 5:
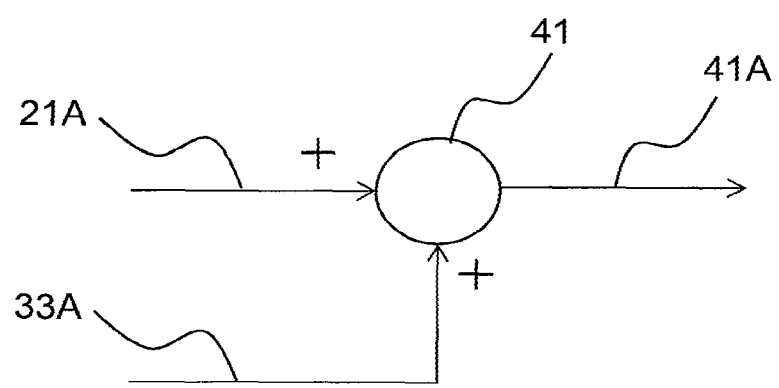
FIG. 5 is a diagram showing the configuration of a temperature calculation unit according to embodiment 1 of the present invention.

FIG. 5 is a diagram showing the configuration of a temperature calculation unit 40 shown in FIG. 1.

Figure 6:
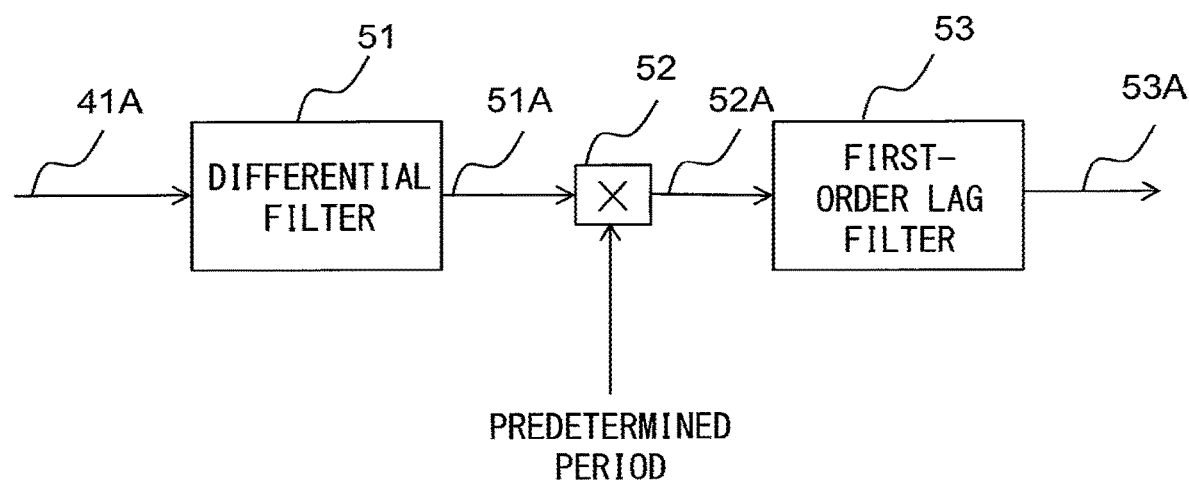
FIG. 6 is a diagram showing the configuration of a temperature change amount prediction unit according to embodiment 1 of the present invention.

FIG. 6 is a diagram showing the configuration of a temperature change amount prediction unit 50 shown in FIG. 1.

Figure 7:
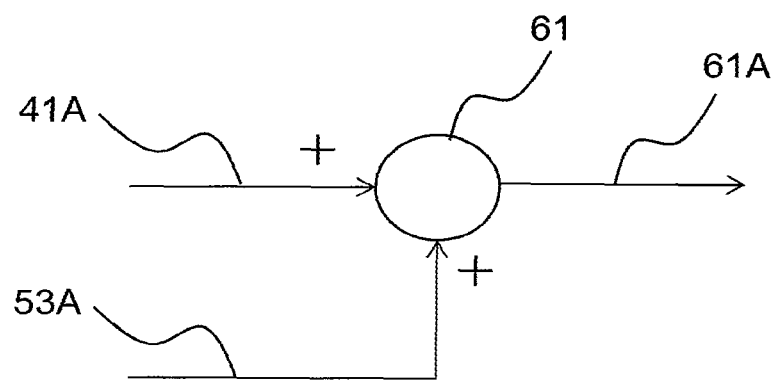
FIG. 7 is a diagram showing the configuration of a temperature prediction unit according to embodiment 1 of the present invention.

FIG. 7 is a diagram showing the configuration of a temperature prediction unit 60 shown in FIG. 1.

Figure 8:
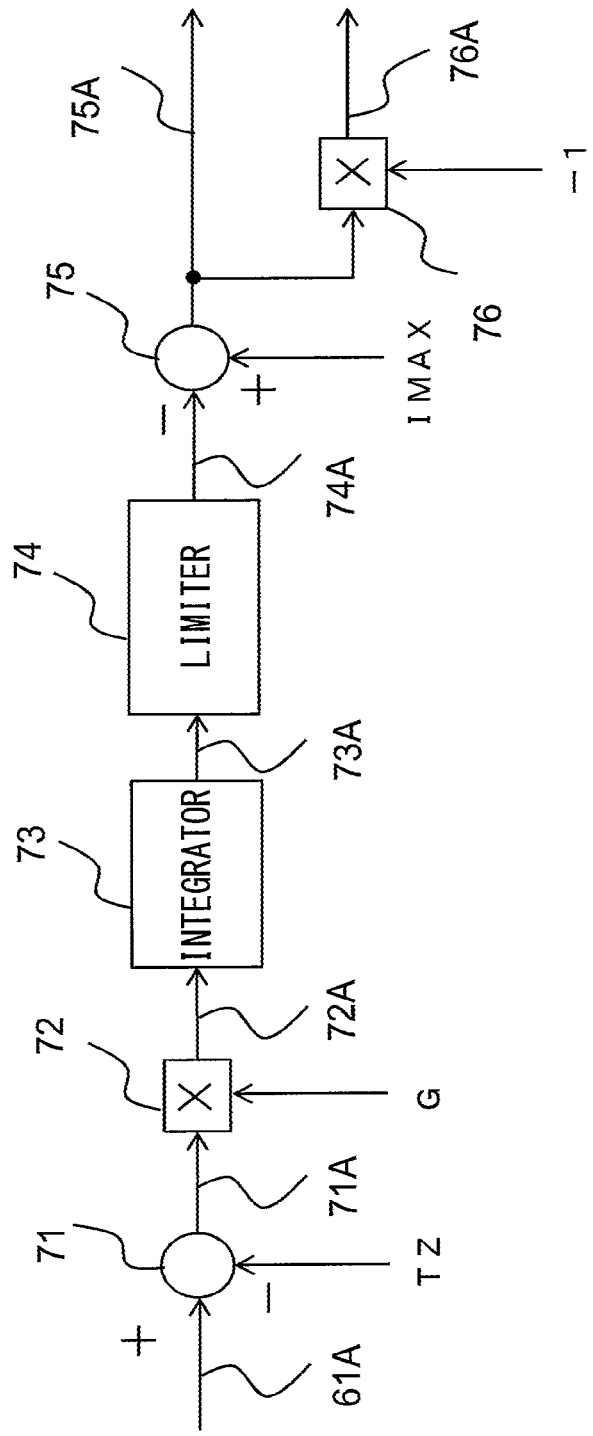
FIG. 8 is a diagram showing the configuration of an upper limit value calculation unit according to embodiment 1 of the present invention.

FIG. 8 is a diagram showing the configuration of an upper limit value calculation unit 70 shown in FIG. 2.

As shown in FIG. 2, the temperature estimation device 100 is provided to the power conversion device 1 as an electric device. First, the configuration and operation of the power conversion device 1 will be described.

The power conversion device 1 is connected between a DC power supply 8 as a power source and a load 9, and passes/receives power between the DC power supply 8 and the load 9.

The power conversion device 1 includes: a conversion circuit 2 having at least one semiconductor switching element 10, and a reactor 3 as an inductor component for limiting current; a control unit 4 which controls the semiconductor switching element 10 of the conversion circuit 2;

the temperature estimation device 100 which estimates the temperature of the reactor 3; the upper limit value calculation unit 70 which calculates a current upper limit value 75A and a current lower limit value 76A described later on the basis of output from the temperature estimation device 100, and provides the calculated values to the control unit 4; a detection unit 5 which detects voltage V and current I between the DC power supply 8 and the conversion circuit 2; a temperature measurement unit 6 which measures a device inside temperature TA (ambient temperature around the reactor 3) in the power conversion device 1; and a fan 7 for cooling the inside of the power conversion device 1.

The detection unit 5 and the temperature measurement unit 6 output detection values of the voltage V and the current I and a measurement value of the device inside temperature TA to the temperature estimation device 100. The fan 7 outputs a fan drive signal S indicating the rotation rate and the driving state thereof, to the temperature estimation device 100.

The circuit configuration of the conversion circuit 2 may be a known circuit configuration, and for example, may be configured by a chopper circuit composed of the semiconductor switching element 10, or a full-bridge circuit composed of the semiconductor switching element 10 and an isolation transformer as an inductor component.

The voltage V and the current I between the power conversion device 1 and the conversion circuit 2 vary depending on electric specifications of the DC power supply 8 and the load 9. In order to adapt to the voltage V and the current I that vary in this way, the control unit 4 causes the semiconductor switching element 10 to perform switching between an ON state and an OFF state. The ON-state period and the OFF-state period in the switching are each adjusted, whereby the flowing current of the reactor 3 increases or decreases. The current I between the power conversion device 1 and the conversion circuit 2 increases or decreases in proportion to the flowing current of the reactor 3.

As an example of adjustment for the switching, in the case of increasing current I, the ON-state period is increased, and in the case of decreasing current I, the OFF-state period is increased. In the case where voltage V decreases, the ON-state period is increased, and in the case where voltage V increases, the OFF-state period is increased. In this way, by increasing or decreasing the flowing current of the reactor 3 through adjustment of the switching, it becomes possible to control power transmitted to the load 9, in accordance with the voltage V and the current I that vary.

In accordance with the flowing current of the reactor 3 and the winding resistance of the reactor 3, conduction loss occurs in the reactor 3, and in accordance with the conduction loss, the temperature of the reactor 3 increases. As described above, the flowing current of the reactor 3 is adjusted through switching in accordance with the voltage V and the current I that vary. Therefore, the temperature of the reactor 3 changes in accordance with the voltage V and the current I. The temperature change in the reactor 3 in accordance with variation in the voltage V and the current I as described above is accompanied with a lag period (hereinafter, referred to as second lag period T2) specific to the reactor 3. That is, the temperature change in the reactor 3 in accordance with variation in the voltage V and the current I occurs with a lag by a time corresponding to the second lag period T2.

The temperature of the reactor 3 also changes in accordance with change in the device inside temperature TA in the power conversion device 1 which corresponds to the ambient temperature around the reactor 3. The temperature change in the reactor 3 in accordance with change in the device inside temperature TA is accompanied with a lag period (hereinafter, referred to as first lag period T1) specific to the reactor 3. That is, the temperature change in the reactor 3 in accordance with change in the device inside temperature TA occurs with a lag by a time corresponding to the first lag period T1.

Thus, the temperature of the reactor 3 increases or decreases in accordance with the device inside temperature TA, and the voltage V and the current I between the DC power supply 8 and the conversion circuit 2. The temperature of the reactor 3 is accompanied with the first lag period T1 with respect to the device inside temperature TA, and is accompanied with the second lag period T2 with respect to the voltage V and the current I.

Next, the configuration and operation of the temperature estimation device 100 for estimating the temperature of the reactor 3 will be described.

As shown in FIG. 1, the temperature estimation device 100 includes: a reference estimation temperature calculation unit 20 as a first calculation unit; a temperature change amount calculation unit 30 as a second calculation unit; a temperature calculation unit 40 as a third calculation unit; a temperature change amount prediction unit 50 as a first prediction unit; and a temperature prediction unit 60 as a second prediction unit. Hereinafter, the configuration of each unit will be described.

First, the configuration of the reference estimation temperature calculation unit 20 will be described.

As shown in FIG. 3, the reference estimation temperature calculation unit 20 operates while receiving the device inside temperature TA measured by the temperature measurement unit 6, and includes a first-order lag filter 21 as a first lag filter. The first-order lag filter 21 provides a first lag period T1 to the device inside temperature TA, and outputs a reference estimation temperature 21A. The outputted reference estimation temperature 21A indicates the temperature of the reactor 3 obtained in accordance with the device inside temperature TA at a time temporally going back by the first lag period T1.

It is noted that the value of the first lag period T1 that the first-order lag filter 21 has is a lag period (transient response period) of temperature change in the reactor 3 with respect to temperature change of the device inside temperature TA, and this lag period can be obtained through examination or verification in advance. The first lag period T1 depends on, for example, the shape and the material of the reactor 3.

Next, the configuration of the temperature change amount calculation unit 30 will be described.

As shown in FIG. 4, the temperature change amount calculation unit 30 operates while receiving detection values of the voltage V and the current I between the DC power supply 8 and the reactor 3 which are detected by the detection unit 5, and the fan drive signal S obtained from the fan 7. The temperature change amount calculation unit 30 includes a conversion unit 31, a comparator 32, and a first-order lag filter 33 as a second lag filter.

Figure 9:
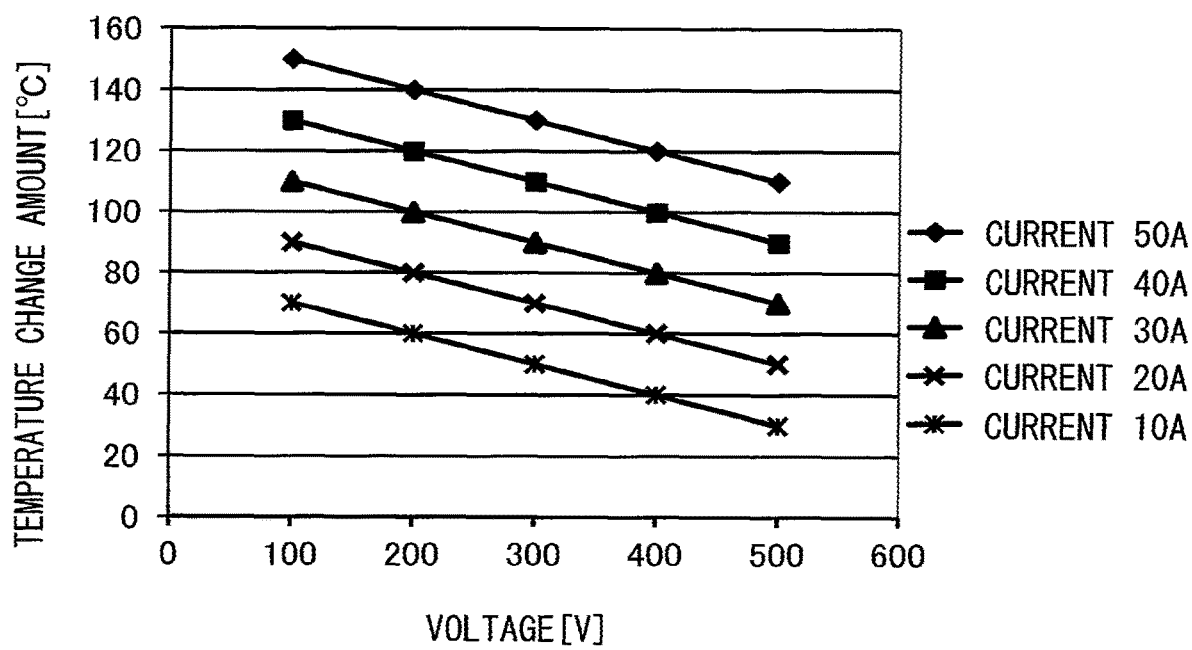
FIG. 9 is a diagram showing temperature change amount conversion data according to embodiment 1 of the present invention.

The conversion unit 31 has a conversion table in which temperature change amount conversion data shown below in FIG. 9 are stored as a table.

FIG. 9 shows voltage [V] on the horizontal axis, and shows the temperature change amount [° C.] on the vertical axis. The graph indicates a final convergence value of the temperature change amount of the reactor 3 obtained in accordance with the inputted voltage V and current I relative to a temperature of the reactor 3 obtained in accordance with voltage V and current I under a predetermined reference condition. That is, the temperature change amount of the reactor 3 indicated on the vertical axis converges with a lag period in accordance with variation in the voltage V and the current I.

For example, it is found that, if voltage V inputted to the temperature change amount calculation unit 30 is 400 V and current I is 10 A, a temperature increase by 40 degrees occurs relative to the temperature of the reactor 3 at the voltage V and current I under the predetermined reference condition.

Thus, the conversion unit 31 obtains, from the conversion table, the temperature change amount of the reactor 3 which changes in accordance with the inputted voltage V and current I. Then, the conversion unit 31 outputs the obtained temperature change amount as a first temperature change amount 31A to the comparator 32 and the first-order lag filter 33.

It is noted that the conversion table may have any configuration as long as the temperature change amount of the reactor 3 in accordance with the inputted voltage V and current I is obtained.

The first-order lag filter 33 provides the second lag period T2 to the inputted first temperature change amount 31A, to calculate a change estimation temperature 33A, and outputs the change estimation temperature 33A to the temperature calculation unit 40 at a subsequent stage. The outputted change estimation temperature 33A indicates the temperature change amount of the reactor 3 obtained in accordance with voltage V and current I at a time temporally going back by the second lag period T2.

It is noted that the value of the second lag period T2 that the first-order lag filter 33 has is a lag period (transient response period) of temperature change in the reactor 3 relative to change in voltage V and current I, and this lag period can be obtained through examination or verification in advance. The second lag period T2 depends on, for example, the shape and the material of the reactor 3.

The second lag period T2 is obtained through examination or verification in advance as described above, and this lag period changes depending on whether the temperature of the reactor 3 is increasing or decreasing.

Hereinafter, control in which the temperature change amount calculation unit 30 determines whether the temperature of the reactor 3 is increasing or decreasing, and adjusts the second lag period T2 in accordance with the determination result, will be described. The determination can be performed by the comparator 32 comparing the magnitude relationship between the first temperature change amount 31A and the change estimation temperature 33A as described below.

The value outputted from the conversion unit 31 with respect to voltage V and current I in a certain calculation cycle is defined as a first temperature change amount 31A-1. The value outputted from the first-order lag filter 33 by receiving the first temperature change amount 31A-1 is defined as a change estimation temperature 33A-1. Then, the value outputted from the conversion unit 31 with respect to voltage V and current I in the subsequent calculation cycle is defined as a first temperature change amount 31A-2.

Here, if the first temperature change amount 31A-2 inputted to the first-order lag filter 33 is greater than the change estimation temperature 33A-1 that has already been outputted from the first-order lag filter 33, the temperature of the reactor 3 is increasing toward the value of the first temperature change amount 31A-2.

On the other hand, if the first temperature change amount 31A-2 inputted to the first-order lag filter 33 is smaller than the change estimation temperature 33A-1 that has been already outputted from the first-order lag filter 33, the temperature of the reactor 3 is decreasing toward the value of the first temperature change amount 31A-2.

The comparator 32 outputs a determination result 32A about the magnitude relationship between the first temperature change amount 31A-2 and the change estimation temperature 33A-1, to the first-order lag filter 33.

The first-order lag filter 33 adjusts the second lag period T2 on the basis of the inputted determination result 32A. Then, the first-order lag filter 33 provides the adjusted second lag period T2 to the first temperature change amount 31A-2, and outputs the resultant change estimation temperature 33A-2.

The second lag period T2 also changes by being influenced by the cooling performance of the fan 7 for cooling the power conversion device 1. Therefore, in addition to adjustment for the second lag period T2 in accordance with the determination result 32A as described above, the temperature change amount calculation unit 30 can also perform adjustment in accordance with the fan drive signal S which indicates the driving state of the cooling fan 7. The first-order lag filter 33 has data obtained by associating the fan drive signal S with the second lag period T2 of the reactor 3 according to voltage V and current I obtained through examination or verification in advance. Thus, the first-order lag filter 33 can adjust the second lag period T2 in accordance with the inputted fan drive signal S.

It is noted that the change estimation temperature 33A can be acquired even if the second lag period T2 is set as a fixed value. In this case, the comparator 32 is omitted, whereby space saving can be achieved.

Next, the configuration of the temperature calculation unit 40 will be described.

As shown in FIG. 5, the temperature calculation unit 40 includes an adder 41. The temperature calculation unit 40 adds the inputted reference estimation temperature 21A and change estimation temperature 33A by the adder 41, to calculate a first estimation temperature 41A. Then, the temperature calculation unit 40 outputs the calculated first estimation temperature 41A to the temperature change amount prediction unit 50 and the temperature prediction unit 60.

As described above, the reference estimation temperature 21A is the temperature of the reactor 3 obtained in accordance with the device inside temperature TA. In addition, the change estimation temperature 33A is the temperature change amount of the reactor 3 obtained in accordance with voltage V and current I. Therefore, the first estimation temperature 41A calculated by the temperature calculation unit 40 is a temperature estimation value for the reactor 3 determined by the device inside temperature TA, the voltage V, and the current I. The reference estimation temperature 21A includes the first lag period T1, and the change estimation temperature 33A includes the second lag period T2. Therefore, the obtained first estimation temperature 41A includes the first lag period T1 and the second lag period T2.

Next, the configuration of the temperature change amount prediction unit 50 will be described.

The temperature change amount prediction unit 50 predicts the temperature change amount, from the first estimation temperature 41A, of the reactor 3 at a time after a predetermined period from when the first estimation temperature 41A is calculated. The reason why this prediction is performed will be described later.

As shown in FIG. 6, the temperature change amount prediction unit 50 includes a differential filter 51 as a slope detector having differential characteristics, a multiplier 52, and a first-order lag filter 53.

The differential filter 51 detects a slope 51A indicating temperature change in the inputted first estimation temperature 41A with respect to time.

As the differential filter 51, an analog filter formed from an analog circuit composed of an operational amplifier, a capacitor, a resistor, and the like, a digital filter formed from a digital circuit such as a microcomputer, or the like may be used.

Here, the characteristics of the differential filter 51 will be described.

FIG. 10 shows an example of a bode plot showing an example of the characteristics of the differential filter 51 according to embodiment 1 of the present invention.

The horizontal axis indicates the frequency of the input signal, and the vertical axis indicates the input/output gain and a phase lag of output relative to input. The feature of the filter having differential characteristics is that the gain increases as the frequency of the input signal increases. The dimension of the first estimation temperature 41A is a temperature (° C.), but via the differential filter 51, the slope 51A (° C./time) of the temperature can be calculated.

Next, the multiplier 52 multiplies the slope 51A by a predetermined period, thereby predicting the temperature change amount 52A which indicates the temperature change amount of the reactor 3 from the first estimation temperature 41A over the predetermined period.

Next, the first-order lag filter 53 levels the temperature change amount 52A by filter processing, thereby calculating a second temperature change amount 53A.

Here, the reason why the temperature change amount 52A is leveled using the first-order lag filter 53 will be described with reference to an example in which a digital filter is used as the differential filter 51.

Calculation in the case of using a digital filter as the differential filter 51 will be shown below.

The digital filter executes the following calculation formula every certain calculation cycle, thereby obtaining the slope 51A.

$$f(t) = \{K0 \times u(t) + K1 \times u(t-1) + K2 \times u(t-2) + u(t-3) - u(t-4) - K2 \times u(t-5) - K1 \times u(t-6) - K0 \times u(t-7)\}/K)$$

f(t): slope 51A (° C./time) of first estimation temperature 41A at time t

K, K0, K1, K2: constant depending on designing u(t): first estimation temperature 41A (° C.) in calculation cycle at time t u(t−1): first estimation temperature 41A (° C.) one calculation cycle before time t u(t−2): first estimation temperature 41A (° C.) two calculation cycles before time t u(t−3): first estimation temperature 41A (° C.) three calculation cycles before time t u(t−4): first estimation temperature 41A (° C.) four calculation cycles before time t u(t−5): first estimation temperature 41A (° C.) five calculation cycles before time t u(t−6): first estimation temperature 41A (° C.) six calculation cycles before time t u(t−7): first estimation temperature 41A (° C.) seven calculation cycles before time t The temperature change amount 52A calculated using the slope 51A calculated by the digital filter as described above is obtained as values discrete from each other by the calculation cycle. Therefore, in order to accurately predict the temperature of the reactor 3, the discrete temperature change amounts 52A are leveled by the first-order lag filter 53, to calculate the second temperature change amount 53A.

In the above calculation formula, eight first estimation temperatures 41A of u(t) to u(t−7) are used. However, u(t) to u(t−5), u(t) to u(t−3), or the like may be used, and the following (Formula 1) may be used.

(Formula 1)

$$f(t) = \frac{1}{K} \sum_{m=0}^{N} K(m)\{u(t-m) - u(t-2N-1+m)\} \quad \text{(Formula 1)}$$

f(t): slope 51A (° C./time) of first estimation temperature 41A at time t

K, K(m): constant depending on designing, where K(N)=1 u(t−m): first estimation temperature 41A in calculation cycle that is m cycles before time t The above (Formula 1) is for calculating the slope 51A using the first estimation temperature 41A in a plurality of calculation cycles. Increasing the number of the first estimation temperatures 41A to be used enhances detection accuracy for the slope 51A, whereas decreasing the number of the first estimation temperatures 41A to be used can reduce the load of calculation processing.

It is noted that the above calculation formula corresponds to the case of N=3 in (Formula 1).

The leveling of the temperature change amount 52A by the first-order lag filter 53 will be described in more detail with reference to the drawings.

Figure 11:
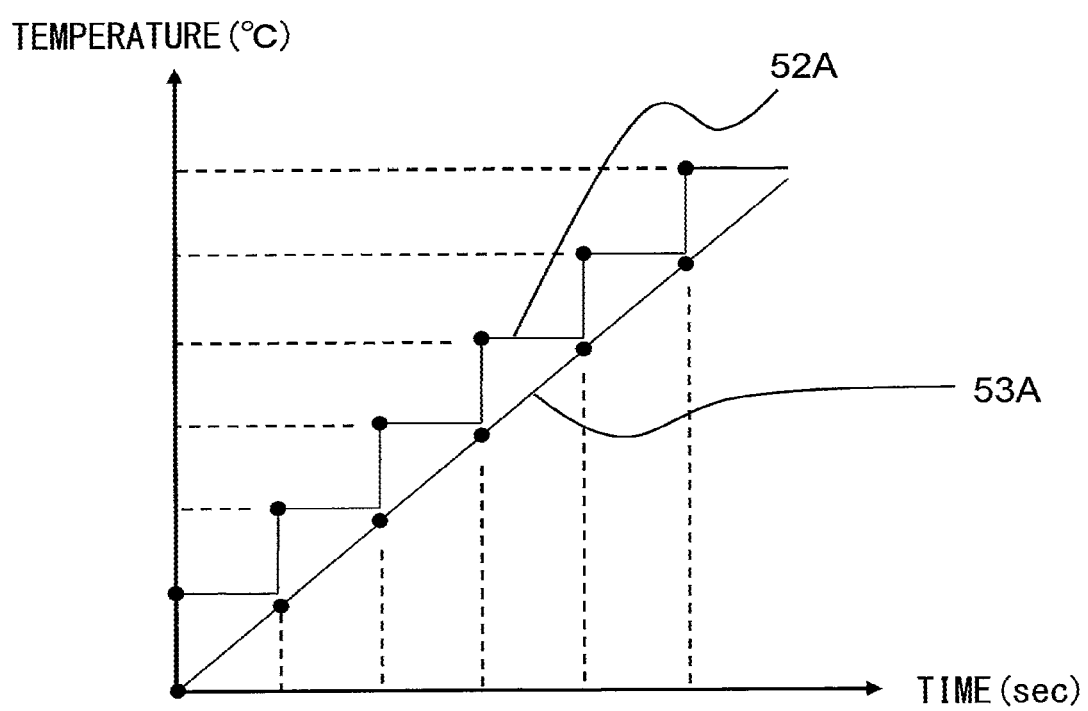
FIG. 11 shows operation of the differential filter according to embodiment 1 of the present invention.

FIG. 11 is a schematic diagram showing the temperature change amount 52A in the case of using a digital filter as the differential filter 51, and the second temperature change amount 53A obtained by leveling the temperature change amount 52A by the first-order lag filter 53. The horizontal axis indicates time, and the vertical axis indicates temperature. It is noted that black dots in the graph indicate timings of executing calculation by the digital filter.

Figure 12:
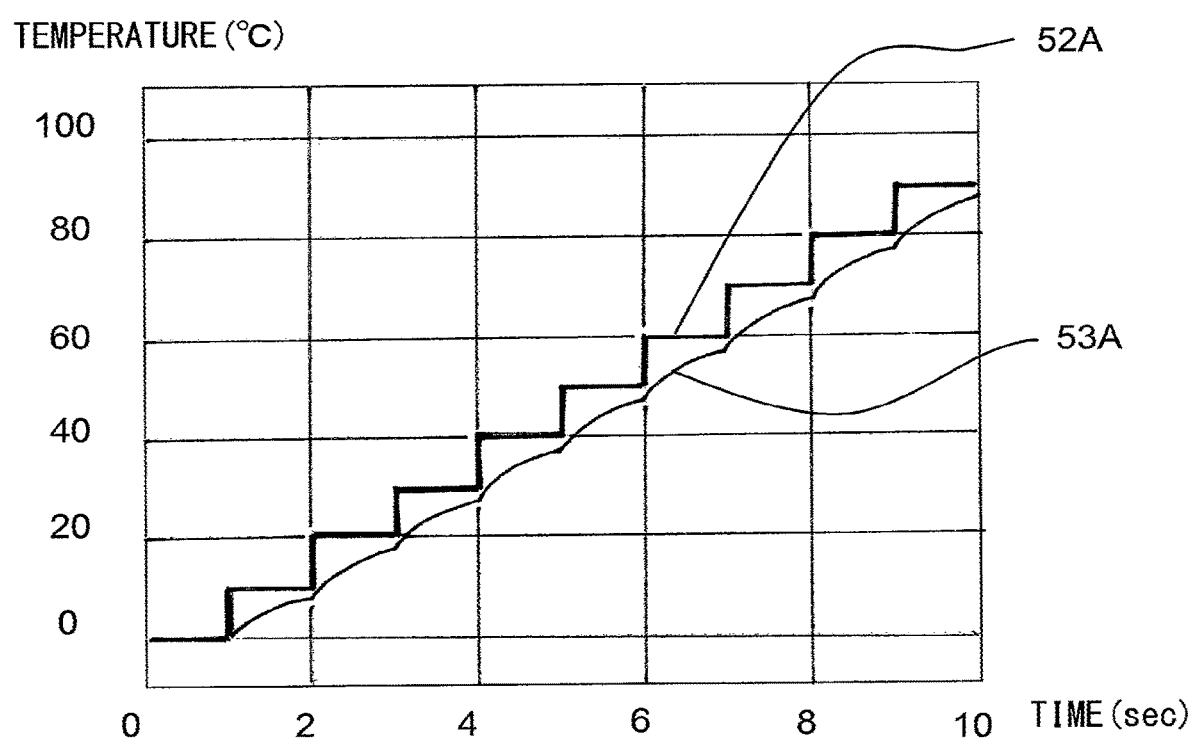
FIG. 12 is a simulation waveform diagram showing operation of the differential filter according to embodiment 1 of the present invention.

FIG. 12 is a waveform diagram showing a result of simulation performed using the temperature estimation device 100 and the power conversion device 1 according to the present embodiment. As in FIG. 11, FIG. 12 shows the temperature change amount 52A in the case of using a digital filter as the differential filter 51, and the second temperature change amount 53A obtained by leveling the temperature change amount 52A by the first-order lag filter 53.

As shown in FIG. 11, the temperature change amount 52A in the case of using a digital filter as the differential filter 51 has a discrete waveform. Then, the second temperature change amount 53A obtained after processing by the first-order lag filter 53 has a continuous waveform. As shown by the waveforms, by using the first-order lag filter 53, the leveled second temperature change amount 53A can be obtained.

It is noted that, in the case of implementing the first-order lag filter 53 by a digital filter, in order to obtain the leveling effect, the calculation cycle of the first-order lag filter 53 is set to be sufficiently shorter than the calculation cycle of the digital filter used for the differential filter 51. For example, in the case where the calculation cycle of the digital filter is 100 seconds, the calculation cycle of the first-order lag filter 53 needs to be roughly 1/10 of the calculation cycle of the digital filter, i.e., about 10 seconds.

As described above, while receiving the first estimation temperature 41A, the temperature change amount prediction unit 50 predicts, as the second temperature change amount 53A, the temperature change amount of the reactor 3 from the first estimation temperature 41A over the predetermined period. The predicted second temperature change amount 53A is outputted to the temperature prediction unit 60 at the subsequent stage.

It is noted that, in the case of not using a digital filter as the differential filter 51, the first-order lag filter 53 may be omitted. In this case, the temperature change amount outputted from the multiplier 52 is outputted as the second temperature change amount to the temperature prediction unit 60.

Next, the configuration of the temperature prediction unit 60 will be described.

As shown in FIG. 7, the temperature prediction unit 60 includes an adder 61. The temperature prediction unit 60 adds the inputted first estimation temperature 41A and second temperature change amount 53A by the adder 61, to calculate a second estimation temperature 61A. In this way, by adding the second temperature change amount 53A to the first estimation temperature 41A, it is possible to predict the second estimation temperature 61A which is the prediction value of the temperature of the reactor 3 at a time after the predetermined period.

Then, as shown in FIG. 2, the temperature prediction unit 60 outputs the calculated second estimation temperature 61A to the upper limit value calculation unit 70 included in the power conversion device 1.

Next, the configuration of the upper limit value calculation unit 70 will be described.

As shown in FIG. 8, the upper limit value calculation unit 70 includes subtractors 71, 75, multipliers 72, 76, an integrator 73, and a limiter 74.

The subtractor 71 subtracts a temperature target value TZ for the reactor 3 from the inputted second estimation temperature 61A, to calculate a temperature deviation 71A. If the second estimation temperature 61A is smaller than the temperature target value TZ, the temperature deviation 71A is a negative value.

The temperature target value TZ is set at a predetermined value not greater than the rated temperature of the reactor 3, and is set at a value obtained by subtracting an appropriately set margin from the rated temperature. The appropriately set margin is a value that can absorb error expected in the calculation process for the second estimation temperature 61A.

The multiplier 72 multiplies the temperature deviation 71A by an integral gain G, and thus outputs a temperature deviation 72A multiplied by the integral gain G.

The integrator 73 integrates the temperature deviation 72A multiplied by the integral gain G, and outputs the resultant value as a current adjustment value 73A.

The limiter 74 limits the current adjustment value 73A by a preset limit value, to calculate a new current adjustment value 74A.

The subtractor 75 subtracts the current adjustment value 74A from a current maximum value IMAX determined by the rated current of the power conversion device 1 and the like, to calculate a current upper limit value 75A. The current upper limit value 75A indicates an upper limit value for the current I passed/received between the conversion circuit 2 and the DC power supply 8.

Here, the current adjustment value 74A will be described. The current adjustment value 74A is a value for adjusting the current, which is needed for deviating from the current range in which the temperature of the reactor 3 might exceed the rated temperature. For example, it is assumed that, if the current I is kept equal to or smaller than 70% of the rated current (current maximum value IMAX), there is no possibility that the temperature of the reactor 3 exceeds the rated temperature. In this case, the required current adjustment value 74A is as follows.

Current adjustment value 74A=current maximum value IMAX−current maximum value IMAX× 70%=current maximum value IMAX×30%

In this case, the limit value preset in the limiter 74 is a value for limiting the current adjustment value 73A so that the current adjustment value 74A outputted from the limiter 74 becomes current maximum value IMAX×30%. By thus providing the limiter 74, excessive current adjustment can be avoided.

It is noted that, in the case where excessive current adjustment is less likely to occur, e.g., in the case where the second estimation temperature 61A can be accurately calculated, the limiter 74 may be omitted.

The multiplier 76 multiplies the current upper limit value 75A obtained as described above, by −1, to calculate a current lower limit value 76A. The reason why multiplication by −1 is performed as described above will be described.

The current lower limit value 76A is needed in the case where the power conversion device 1 is capable of not only discharging but also charging for the DC power supply 8. That is, if the current upper limit value 75A is a limit value for the case of discharging from the DC power supply 8, the current lower limit value 76A is a limit value for the case of charging from the DC power supply 8. Therefore, a value obtained by multiplying the current upper limit value 75A by −1 is used as the current lower limit value 76A. This is based on the premise that the characteristics of temperature increase in the reactor 3 with respect to current are the same between charging and discharging. It is noted that the preset lower limit value is 0 Å (A: unit of current, ampere).

The current upper limit value 75A and the current lower limit value 76A obtained as described above are outputted to the control unit 4 of the power conversion device 1, as shown in FIG. 2.

When the current upper limit value 75A which is the upper limit value for the current I is inputted to the control unit 4 of the power conversion device 1, as described at the initial part, the control unit 4 adjusts switching of the semiconductor switching element 10 so that the current I does not exceed the current upper limit value 75A, by a pulse width modulation method of known technology. Thus, the current I between the power conversion device 1 and the DC power supply 8 is adjusted.

In the case where the second estimation temperature 61A is greater than the temperature target value TZ, the control unit 4 performs adjustment so as to limit and decrease the current I. Thus, the flowing current of the reactor 3 decreases and conduction loss reduces, whereby temperature increase in the reactor 3 is suppressed. On the other hand, in the case where the second estimation temperature 61A is smaller than the temperature target value TZ, the control unit 4 performs adjustment so as to relax limitation for the current I, within such a range that the temperature of the reactor 3 does not exceed the target temperature value TZ.

In this way, the power conversion device 1 operates the conversion circuit 2 while keeping the temperature of the reactor 3 within a range not exceeding the temperature target value TZ, on the basis of the second estimation temperature 61A of the reactor 3 estimated by the temperature estimation device 100.

As described above, for the temperature target value TZ, a margin is set in consideration of error in the calculation process for the second estimation temperature 61A, and therefore, it is possible to more stably keep the temperature of the reactor 3 equal to or smaller than the temperature target value TZ.

Hereinafter, the reason why the temperature change amount prediction unit 50 and the temperature prediction unit 60 described above predict the temperature change amount, from the first estimation temperature 41A, of the reactor 3 at a time after a predetermined period from when the first estimation temperature 41A is calculated, will be described.

As described above, the reference estimation temperature 21A calculated by the reference estimation temperature calculation unit 20 includes the first lag period T1. In addition, the change estimation temperature 33A calculated by the temperature change amount calculation unit 30 includes the second lag period T2. Therefore, the first estimation temperature 41A calculated by the temperature calculation unit 40 and indicating the estimation temperature of the reactor 3 includes the first lag period T1 and the second lag period T2.

Here, it is assumed that, on the basis of the first estimation temperature 41A at time t1, the conversion circuit 2 of the power conversion device 1 is controlled so that the current I between the conversion circuit 2 and the DC power supply 8 decreases at time t2. However, the first estimation temperature 41A is associated with the device inside temperature TA in the past going back by the first lag period T1 from time t1, and the voltage V and the current I in the past going back by the second lag period T2 from time t1. Therefore, even if adjustment for the current I is started at time t2, temperature decrease in the reactor 3 with respect to the adjusted current I is not obtained until a period corresponding to the first lag period T1 and the second lag period T2 elapses from time t2. Therefore, there is a possibility that the temperature of the reactor 3 continues to increase from the first estimation temperature 41A at time t1.

In order to cope with adjustment for operation control of the power conversion device 1 as described above, the temperature estimation device 100 needs to predict the temperature of the reactor 3 at a time after a predetermined period in which the first lag period T1 and the second lag period T2 are considered in advance elapses from time t1. Therefore, prediction for the temperature of the reactor 3 at a time after the predetermined period is performed by the temperature change amount prediction unit 50 and the temperature prediction unit 60.

As the predetermined period, an optional value may be set. If the lag period of temperature change in the reactor 3 is used as the predetermined period, it is possible to predict the second estimation temperature 61A of the reactor 3 at a time after the predetermined period in which a lag period relevant to adjustment for the voltage V and the current I is considered. In this case, the influence of the second lag period T2 is great, and therefore the second lag period T2 may be used as the predetermined period.

In the temperature estimation device 100 according to the present embodiment configured as described above, even if the first lag period T1 with respect to the device inside temperature TA and the second lag period T2 with respect to the voltage V and the current I are different from each other, it is possible to accurately estimate the first estimation temperature 41A of the reactor 3 by adding the reference estimation temperature 21A to which the first lag period T1 is provided and the change estimation temperature 33A to which the second lag period T2 is provided. Then, the second estimation temperature 61A of the reactor 3 at a time after the predetermined period from the time when the first estimation temperature 41A is calculated can be calculated on the basis of the slope 51A of the first estimation temperature 41A which includes the first lag period T1 and the second lag period T2 as described above. Therefore, it is possible to accurately predict the second estimation temperature 61A.

The first lag period T1 is set on the basis of the transient response period of the reactor 3 with respect to the device inside temperature TA, and the second lag period T2 is set on the basis of the transient response period of the reactor 3 with respect to the voltage V and the current I. Thus, since the values obtained on the basis of the shape and the material of the actual reactor 3 are used for the first lag period T1 and the second lag period T2, the temperature of the reactor 3 can be calculated more accurately.

The reference estimation temperature calculation unit 20 and the temperature change amount calculation unit 30 provide the first lag period T1 and the second lag period T2 to the device inside temperature TA and the first temperature change amount 31A, by using the lag filters, respectively. Thus, it is possible to efficiently provide the lag periods by using the lag filters.

As the lag filters, first-order lag filters are used. Thus, by using the first-order lag filters, it is possible to obtain the reference estimation temperature 21A and the change estimation temperature 33A corresponding to the transient response characteristics of the reactor 3.

The temperature change amount prediction unit 50 calculates the slope 51A of the first estimation temperature 41A by the slope detector such as the differential filter 51. Therefore, it is possible to efficiently obtain the slope of the first estimation temperature 41A.

In the temperature change amount prediction unit 50, it is also possible to calculate the slope 51A of the first estimation temperature 41A by Formula (1), using a digital filter as the differential filter 51. Therefore, it is possible to accurately calculate the slope 51A using a desired number of the first estimation temperatures 41A obtained in respective calculation cycles.

The value of the second lag period T2 can be adjusted in accordance with whether the temperature of the reactor 3 is increasing or decreasing. Thus, by appropriately adjusting the second lag period T2, it is possible to appropriately cope with change in the second lag period T2 depending on the temperature state of the reactor 3. Thus, the temperature of the reactor 3 can be estimated more accurately.

The second lag period T2 can also be adjusted in accordance with the fan drive signal S from the fan 7. Thus, it is possible to estimate the temperature of the reactor 3 more accurately on the basis of the cooling state of the reactor 3 in the power conversion device 1.

By using the second lag period T2 as the predetermined period to be used in the temperature change amount prediction unit 50, it is possible to calculate the current upper limit value 75A and the current lower limit value 76A in which the lag period of temperature change in the reactor 3 according to the voltage V and the current I is considered.

In the power conversion device 1 according to the present embodiment configured as described above, while the temperature estimation device 100 accurately predicts the second estimation temperature 61A of the reactor 3 at a time after the predetermined period, the current I is adjusted on the basis of the current upper limit value 75A and the current lower limit value 76A calculated from the second estimation temperature 61A and the temperature target value TZ for the reactor 3. Thus, it is possible to cause the temperature of the reactor 3 to converge within a range not exceeding the temperature target value TZ, even after the predetermined period. Therefore, the power conversion device 1 can be prevented from being stopped by the temperature of the reactor 3 exceeding the rated temperature. In addition, operation of the fan 7 of the power conversion device 1 is prevented from being performed over a period longer than necessary, and the current I is prevented from being excessively reduced. Thus, it becomes possible to perform stable continuous operation of the power conversion device 1. In addition, since it is only necessary to perform output control for the conversion circuit 2 so as not to exceed the current upper limit value 75A calculated by the upper limit value calculation unit 70, control becomes easy.

In addition, since the temperature of the reactor 3 is kept equal to or smaller than the temperature target value TZ, an effect of avoiding size increase of the reactor 3 can also be obtained.

The upper limit value calculation unit 70 calculates the current upper limit value 75A, using the current adjustment value 73A obtained by integrating the temperature deviation 71A between the second estimation temperature 61A and the temperature target value TZ. Thus, by using the current adjustment value 74A obtained by temporally accumulating the temperature deviation 71A, it is possible to accurately cause the temperature of the reactor 3 to approach the temperature target value TZ.

In addition, since the current adjustment value 74A is calculated by the limiter 74 limiting the current adjustment value 73A, it is possible to avoid excessive current adjustment.

Figure 13:
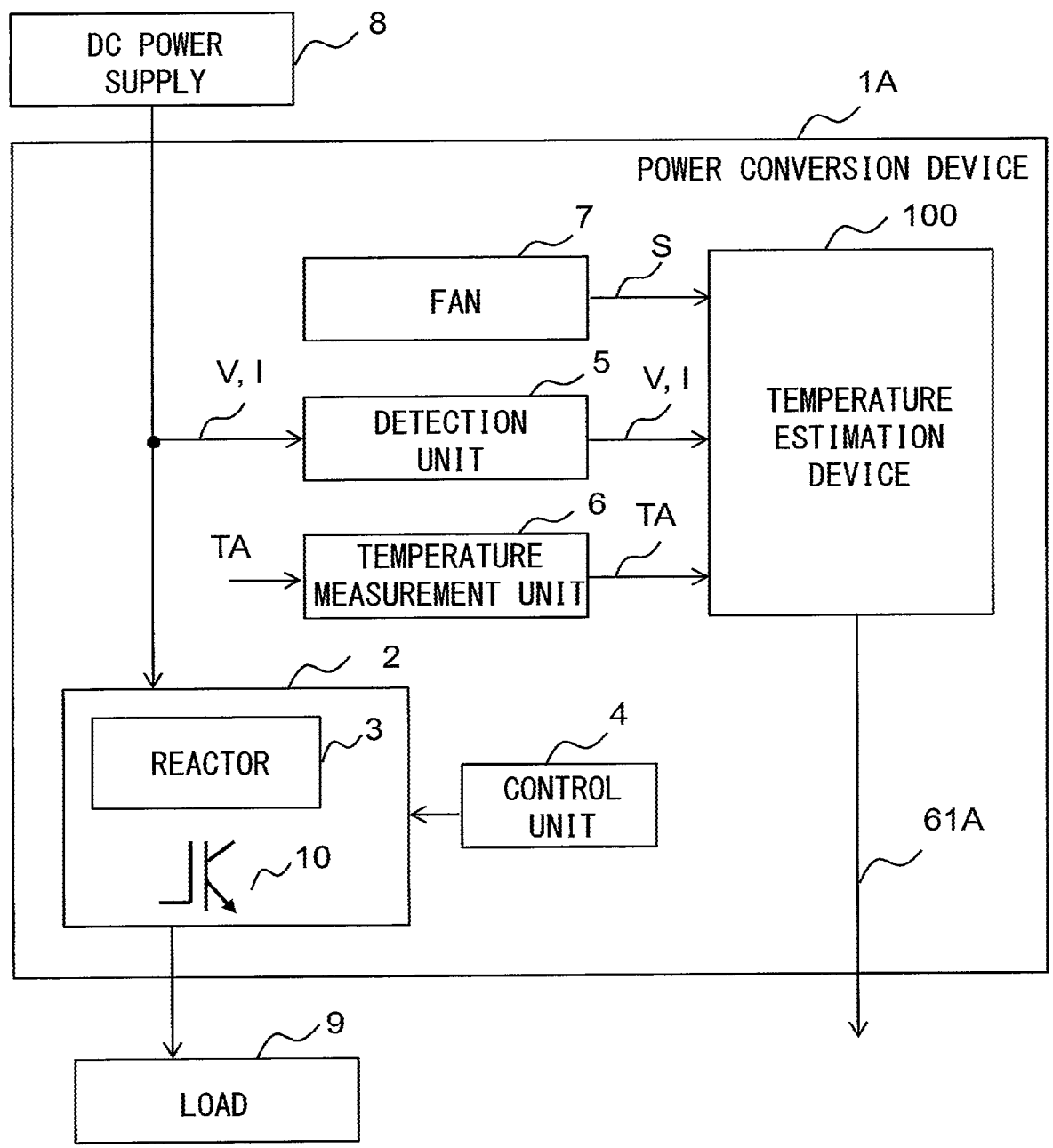
FIG. 13 is a diagram showing another configuration example of a power conversion device including the temperature estimation device according to embodiment 1 of the present invention.

FIG. 13 is a diagram showing a power conversion device 1A having another configuration including the temperature estimation device 100 according to embodiment 1 of the present invention.

As shown in FIG. 13, the power conversion device 1A is configured without the upper limit value calculation unit 70. Also in the power conversion device 1A having such a configuration, as in the above power conversion device 1, it is possible to adjust current I using the second estimation temperature 61A estimated by the temperature estimation device 100. For example, the temperature estimation device 100 outputs the second estimation temperature 61A to outside of the power conversion device 1A, whereby it is possible to prompt an operator for the power conversion device 1A to make change or adjustment for control of the conversion circuit 2.

Thus, the power conversion device 1A provides the same effects as those of the above power conversion device 1, and can suppress temperature increase in the reactor 3 on the basis of the second estimation temperature 61A estimated accurately. In addition, the power conversion device 1A can be prevented from being stopped by the temperature of the reactor 3 exceeding the rated temperature. In addition, operation of the fan 7 of the power conversion device 1A is prevented from being performed over a period longer than necessary, and the current I is prevented from being excessively reduced. Thus, it becomes possible to perform stable continuous operation of the power conversion device 1A. In addition, since the upper limit value calculation unit 70 is not provided, space saving and cost reduction can be achieved.

It is noted that, within the scope of the present invention, the above embodiment may be modified or simplified as appropriate.

The invention claimed is:

1. A temperature estimation device for estimating a temperature of an inductor component in an electric device connected to a DC power supply, the temperature estimation device comprising:
a first calculation unit which receives a device inside temperature of the electric device, provides a first lag period to the device inside temperature, and outputs a reference estimation temperature of the inductor component;
a second calculation unit which calculates a first temperature change amount of the inductor component on the basis of detection values of voltage and current between the DC power supply and the electric device, provides a second lag period to the first temperature change amount, and outputs a resultant value;
a third calculation unit which adds the output from the second calculation unit, to the reference estimation temperature, to calculate a first estimation temperature of the inductor component;
a first prediction unit which predicts, on the basis of the first estimation temperature, a second temperature change amount of the inductor component from the first estimation temperature over a predetermined period; and
a second prediction unit which adds the second temperature change amount to the first estimation temperature, to predict a second estimation temperature of the inductor component.

2. The temperature estimation device according to claim 1, wherein
the first lag period of the first calculation unit is set on the basis of a transient response period of the inductor component with respect to the device inside temperature, and
the second lag period of the second calculation unit is set on the basis of a transient response period of the inductor component with respect to the voltage and the current.

3. The temperature estimation device according to claim 1, wherein
the first calculation unit includes a first lag filter and provides the first lag period by the first lag filter, and
the second calculation unit includes a second lag filter and provides the second lag period by the second lag filter.

4. The temperature estimation device according to claim 1, wherein
the first prediction unit includes a slope detector, detects a slope of the first estimation temperature by the slope detector, and calculates the second temperature change amount on the basis of the slope.

5. The temperature estimation device according to claim 4, wherein
the slope detector detects the slope on the basis of the following Formula 1:

$$f(t) = \frac{1}{K}\sum_{m=0}^{N} K(m)\{u(t-m) - u(t-2N-1+m)\} \quad \text{Formula 1}$$

where f(t) is the slope (° C./time) of the first estimation temperature at time t, K and K(m) are constants depending on designing, with K(N)=1, and u(t−m) is the first estimation temperature in a calculation cycle that is m cycles before time t.

6. The temperature estimation device according to claim 1, wherein
the second lag period of the second calculation unit is adjusted in accordance with a magnitude relationship between the first temperature change amount and the output of the second calculation unit.

7. The temperature estimation device according to claim 1, wherein
the second lag period of the second calculation unit is adjusted in accordance with a signal from a cooling unit provided in the electric device.

8. The temperature estimation device according to claim 1, wherein
the predetermined period in the first prediction unit is set to be equal to the second lag period of the second calculation unit.

9. The temperature estimation device according to claim 3, wherein
the first lag filter and the second lag filter are first-order lag filters.

10. An electric device comprising:
the temperature estimation device according to claim 1;
an upper limit value calculation unit which calculates a current upper limit value for limiting current passed/received between the electric device and the DC power supply, on the basis of the second estimation temperature and a temperature target value for the inductor component; and
a control unit which controls output of the electric device, wherein
the control unit adjusts the current on the basis of the current upper limit value.

11. The electric device according to claim 10, wherein
the upper limit value calculation unit generates a current adjustment value on the basis of a temperature deviation between the second estimation temperature and the temperature target value, and subtracts the current adjustment value from a maximum current value based on rated current of the electric device, to calculate the current upper limit value.

12. The electric device according to claim 11, wherein
the upper limit value calculation unit generates the current adjustment value on the basis of a value obtained by integrating the temperature deviation.

13. The electric device according to claim 11, wherein
the upper limit value calculation unit includes a limiter and limits the current adjustment value by the limiter.

14. The electric device according to claim 10, wherein
the electric device is a power conversion device which includes a conversion circuit having at least one semiconductor switching element, and which, by the control unit, converts voltage from the DC power supply, to desired voltage through switching operation of the semiconductor switching element, and outputs the desired voltage from the conversion circuit.

15. The temperature estimation device according to claim 2, wherein
the first calculation unit includes a first lag filter and provides the first lag period by the first lag filter, and
the second calculation unit includes a second lag filter and provides the second lag period by the second lag filter.

16. The temperature estimation device according to claim 2, wherein
the first prediction unit includes a slope detector, detects a slope of the first estimation temperature by the slope detector, and calculates the second temperature change amount on the basis of the slope.

17. The temperature estimation device according to claim 3, wherein
the first prediction unit includes a slope detector, detects a slope of the first estimation temperature by the slope detector, and calculates the second temperature change amount on the basis of the slope.

18. The temperature estimation device according to claim 16, wherein
the slope detector detects the slope on the basis of the following Formula 1:

$$f(t) = \frac{1}{K}\sum_{m=0}^{N} K(m)\{u(t-m) - u(t-2N-1+m)\} \quad \text{Formula 1}$$

where
f(t) is the slope (° C./time) of the first estimation temperature at time t, K and K(m) are constants depending on designing, with K(N)=1, and u(t−m) is the first estimation temperature in a calculation cycle that is m cycles before time t.

19. The temperature estimation device according to claim 2, wherein
the second lag period of the second calculation unit is adjusted in accordance with a magnitude relationship between the first temperature change amount and the output of the second calculation unit.

20. An electric device comprising:
the temperature estimation device according to claim 2;
an upper limit value calculation unit which calculates a current upper limit value for limiting current passed/received between the electric device and the DC power supply, on the basis of the second estimation temperature and a temperature target value for the inductor component; and
a control unit which controls output of the electric device, wherein
the control unit adjusts the current on the basis of the current upper limit value.

* * * * *